(12) United States Patent
Kim

(10) Patent No.: US 7,898,050 B2
(45) Date of Patent: Mar. 1, 2011

(54) IMAGE SENSOR AND METHOD FOR MANUFACTURING THE SENSOR

(75) Inventor: Dae-Young Kim, Icheon-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 215 days.

(21) Appl. No.: 12/131,185

(22) Filed: Jun. 2, 2008

(65) Prior Publication Data

US 2009/0160000 A1 Jun. 25, 2009

(30) Foreign Application Priority Data

Dec. 24, 2007 (KR) .................. 10-2007-0136247

(51) Int. Cl.
*H01L 29/72* (2006.01)
(52) U.S. Cl. .................. 257/436; 257/294; 257/432; 257/434; 257/435
(58) Field of Classification Search .............. 257/294, 257/432, 434, 435, 436
See application file for complete search history.

(56) References Cited

U.S. PATENT DOCUMENTS

2006/0231898 A1* 10/2006 Jeong et al. .................. 257/359
2007/0235756 A1* 10/2007 Kato .......................... 257/184

FOREIGN PATENT DOCUMENTS

KR 10-1999-0013793 2/1999

\* cited by examiner

*Primary Examiner*—Edward Wojciechowicz
(74) *Attorney, Agent, or Firm*—Sherr & Vaughn, PLLC

(57) ABSTRACT

An image sensor and a method for manufacturing the sensor are provided for reducing loss of light reflected from photodiodes, and thus, improving light efficiency. The method of manufacturing an image sensor can include providing a semiconductor substrate having a photodiode; and then forming a reflective film frame on the photodiode, the reflective film frame having sidewalls that are inclined with respect to the uppermost surface of the photodiode; and then forming an opening over the surface of the reflective film frame and corresponding to the photodiode by forming a reflective film on the sidewalls of the reflective film frame.

7 Claims, 3 Drawing Sheets

IMAGE SENSOR AND METHOD FOR MANUFACTURING THE SENSOR

The present application claims priority under 35 U.S.C. 119 to Korean Patent Application No. 10-2007-0136247 (filed on Dec. 24, 2007), which is hereby incorporated by reference in its entirety.

BACKGROUND

An image sensor is a semiconductor device which converts an optical image into an electrical signal. The image sensor may be classified generally into a charge coupled device (CCD) image sensor and a complementary metal oxide semiconductor (CMOS) image sensor. The CMOS image sensor may include a photodiode for sensing illuminated light and a CMOS logic circuit for processing the detected light into an electrical signal to produce data.

As the amount of light received by the photodiode becomes larger, the image sensor has more increased photosensitivity. The photosensitivity can be improved by increasing a fill factor representing a ratio of an area of the photodiode to an entire area of the image sensor, or by changing a path of light incident on an area except the photodiode to focus the light on the photodiode. As a representative example of a light focusing technology, a micro lens (generally, a convex micro lens) may be formed on and/or over the photodiode using a highly light-transmissive material. The micro lens refracts incident light to illuminate a larger amount of light on and/or over the photodiode. In this case, light parallel to an optical axis of the micro lens is refracted by the micro lens, and a focus is formed at a specific position on the optical axis.

Further, in the CMOS image sensor, a portion of the light incident on the photodiode may be reflected by the photodiode, thereby reducing the light focusing efficiency. Accordingly, there is a disadvantage of reducing the photosensitivity of the image sensor. Thus, a reflective film may be formed above the side surface of the photodiode to reduce loss of the reflected light as disclosed in Korean Patent Application No. 10-2005-0134399, filed by the present applicant.

Figure 1:
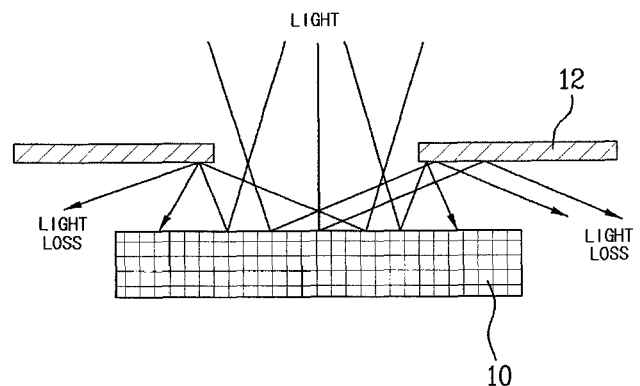

As illustrated in example FIG. 1, a CMOS image sensor may include photodiode 10 and reflective film 12 formed above and parallel to photodiode 10. By this configuration, it is possible to partially prevent loss of light reflected from photodiode 10. Meaning, the CMOS image sensor illustrated in example FIG. 1 may exhibit high light efficiency since light reflected from photodiode 10 is reflected by reflective film 12 to photodiode 10. However, a large amount of the reflected light is lost out of photodiode 10.

SUMMARY

Embodiments relate to an image sensor and a method for manufacturing the sensor having improved light focusing efficiency.

Embodiments relate to an image sensor and a method for manufacturing the sensor that is capable of preventing loss of light by returning light reflected from photodiodes to the photodiodes.

Embodiments relate to a method of manufacturing an image sensor that can include at least one of the following steps: forming an insulating film on and/or over a semiconductor substrate having a plurality of photodiodes; and then forming a hard mask pattern corresponding to the photodiodes on and/or over the insulating film; and then forming reflective film frames having inclined sidewalls by wet etching the insulating film using the hard mask pattern as an etching mask; and then removing the hard mask pattern; and then forming a reflective film layer on and/or over an entire surface of the semiconductor substrate to cover the reflective film frames; and then forming reflective films having an opening positioned above the photodiodes to receive light by selectively removing the reflective film layer through a photolithography process.

Embodiments relate to an image sensor that can include at least one of the following: a plurality of photodiodes formed on and/or over a semiconductor substrate; reflective film frames which have a width decreasing from bottom to top and are formed on and/or over the photodiodes; and reflective films which cover the reflective film frames and have openings to receive light.

Embodiments relate to a method that can include at least one of the following steps: providing a semiconductor substrate having a photodiode; and then forming a reflective film frame on the photodiode, the reflective film frame having sidewalls that are inclined with respect to the uppermost surface of the photodiode; and then forming an opening over the surface of the reflective film frame and corresponding to the photodiode by forming a reflective film on the sidewalls of the reflective film frame.

In the image sensor and the method of manufacturing the same according to the present invention, the reflective films can be formed to be inclined and bent on and/or over the respective photodiodes, thereby returning light reflected from the photodiodes to the photodiodes to a maximum extent. Thus, there is an effect of reducing loss of light reflected from the photodiodes and improving light efficiency.

DRAWINGS

Figure 2:
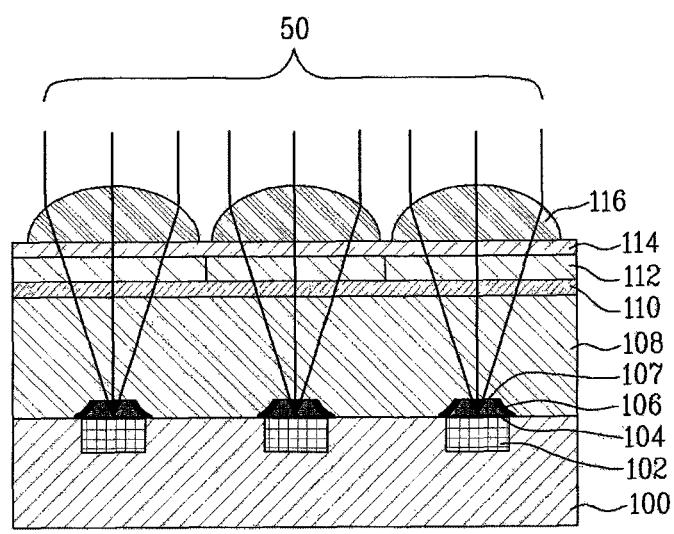
Figure 3:
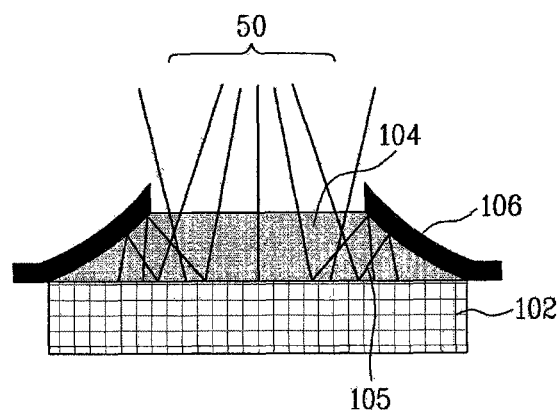

Example FIG. 1 illustrates an enlarged view of a portion including a photodiode in a conventional CMOS image sensor;

Example FIGS. 2 to 4 illustrate an image sensor and a method of manufacturing the image sensor, in accordance with embodiments.

DESCRIPTION

Reference will now be made in detail to the preferred embodiments of the present invention, examples of which are illustrated in the accompanying drawings. Wherever possible, the same reference numbers will be used throughout the drawings to refer to the same or like parts.

As illustrated in example FIG. 2, an image sensor in accordance with embodiments can include a plurality of photodiodes 102 are formed in semiconductor substrate 100 and serve to sense light to produce charges according to the amount of incident light. The image sensor, which can serve as a light sensing device, may employ a plurality of photogates instead of photodiodes 102. Further, although photodiodes 102 are formed in semiconductor substrate 100, the image sensor in accordance with embodiments is not limited thereto, and thus, can be disposed on and/or over semiconductor substrate 100. A plurality of reflective film frames 104 have a width decreasing from bottom to top, i.e., substantially conical-shaped, can be used to form reflective films 106 as will be described later. Reflective film frames 104 can be formed on and/or over photodiodes 102, respectively. Reflective films 106 can be composed of a metal material and can cover reflective film frames 104 and have openings 107 for receiving light. The size of openings 107 can vary in accordance with the size of photodiodes 102. In accordance with embodiments, openings 107 can occupy between 70 to 90% of the uppermost surface area of photodiodes 102.

The image sensor in accordance with embodiments can also include interlayer insulating film 108, protective film 110, a plurality number of color filter layers 112, planarization layer 114 and a plurality of micro lenses 116 corresponding to a respective photodiode 102. The image sensor in accordance with embodiments is not limited to such a structure and can include any structure so long as reflective films 106 and reflective film frames 104 are respectively disposed on and/or over photodiodes 102 to have a structure to receive light into photodiodes 102. Meaning, interlayer insulating film 108, protective film 110, color filter layers 112, planarization layer 114 and micro lenses 116 can be configured differently from the manner illustrated in example FIG. 2.

The respective layers are explained as follows. Interlayer insulating film 108 can be formed on and/or over semiconductor substrate 100 including reflective films 106. Protective film 110 can be formed on and/or over interlayer insulating film 108 to protect the device from moisture and scratching. Color filter layers 112 can be formed on and/or over protective film 110 at specific intervals. Color filter layers 112 can serve to pass red (R), green (G), and blue (B) light in a specific wavelength band therethrough, respectively. Planarization layer 114 can be formed on and/or over the entire surface of the semiconductor substrate 100 including respective color filter layers 112 and serve to adjust a focal length on and/or over color filter layers 112 and to ensure flatness for forming a lens layer. Micro lenses 116 can be formed having a convex shape of a specific curvature on and/or over planarization layer 114 and can correspond to the respective photodiodes 102. Micro lenses 116 can serve to concentrate a larger amount of light on and/or over photodiodes 102 through color filter layers 112 according to the wavelength when natural light is illuminated. The curvature and height of micro lenses 116 can be determined with regard to various factors such as a focus of concentrated light.

As illustrated in example FIGS. 2 and 3, light 50 which is projected from a light source onto the image sensor in accordance with embodiments can be collected in micro lenses 116. The collected light passes through planarization layer 114 and is filtered through color filter layers 112. Then, the light passes through protective film 110 and interlayer insulating film 108 and reaches photodiodes 102. Light 105 reflected from photodiodes 102 can return to photodiodes 102 after being reflected by reflective films 106.

Hereinafter, a manufacturing method, configuration and operation of the image sensor in accordance with embodiments will be described with reference to the accompanying drawings.

Figure 4A:
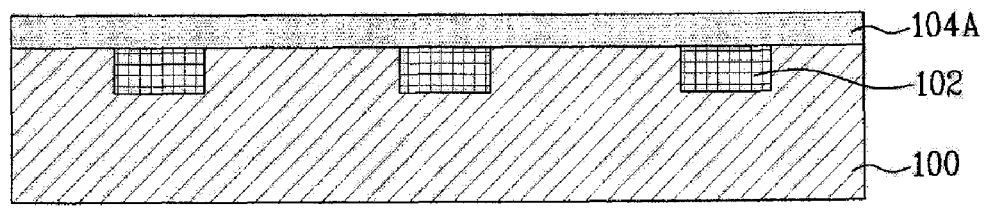

As illustrated in example FIG. 4A, a plurality of photodiodes 102 can be formed in semiconductor substrate 100. Photodiodes 102 can alternatively be formed on and/or over semiconductor substrate 100. Insulating film 104A can then be formed on and/or over semiconductor substrate 100 including photodiodes 102. Insulating film 104A can be formed of an oxide film.

Figure 4B:
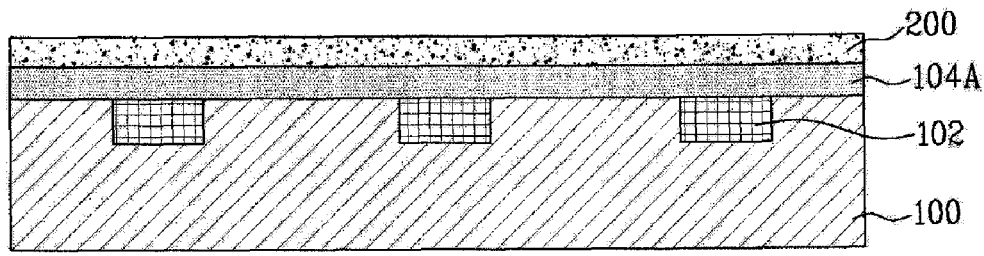
Figure 4C:
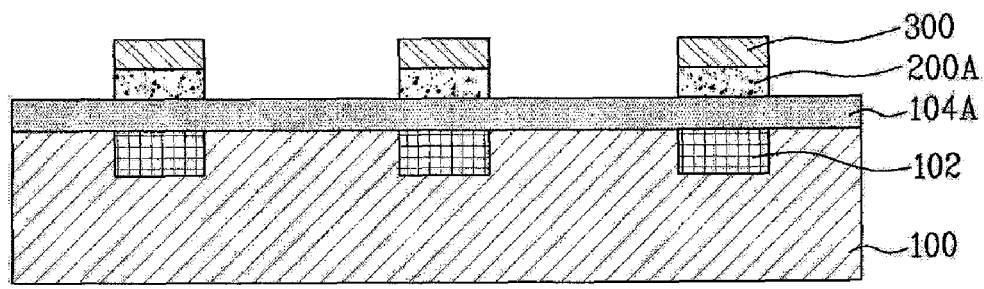
Figure 4D:
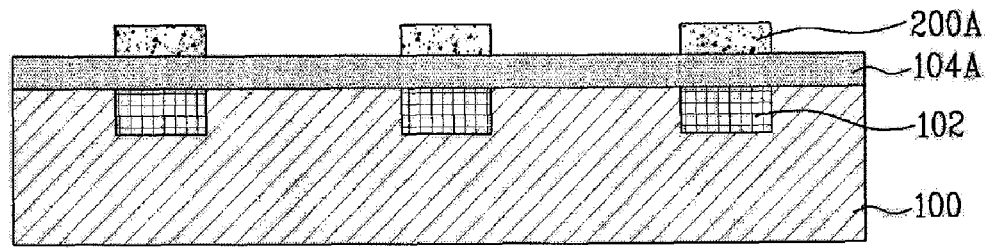

As illustrated in example FIGS. 4B to 4D, a hard mask pattern corresponding to photodiodes 102 can then be formed on and/or over insulating film 104A as follows. Layer 200 for hard mask pattern 200A can be formed on and/or over insulating film 104A. Layer 200 for hard mask pattern 200A can be made of silicon nitride (SiN). Photoresist film pattern 300 can then be formed on and/or over layer 200 to expose a region of photodiodes 102. Hard mask pattern 200A can then be formed through a photolithography process using photoresist film pattern 300. When hard mask pattern 200A has been formed as described above, photoresist film pattern 300 can be removed by ashing.

Figure 4E:
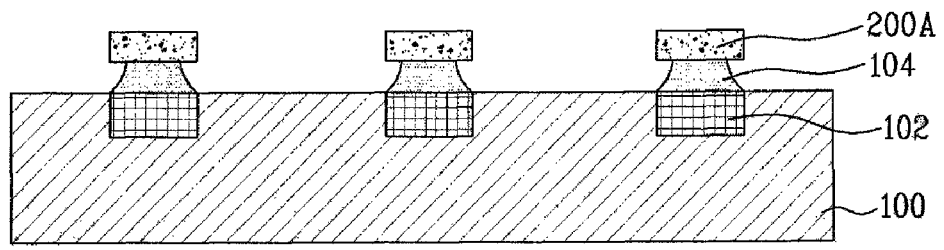
Figure 4F:
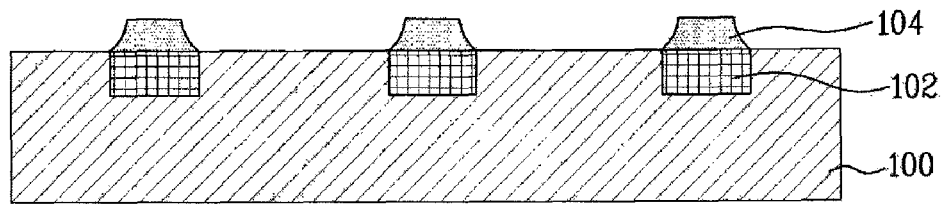

As illustrated in example FIGS. 4E and 4F, insulating film 104A can then be wet-etched using hard mask pattern 200A as an etching mask to form reflective film frames 104 having a width decreasing from bottom to top. The wet etching for forming reflective film frames 104 can be performed at a temperature of 80~160° C. using a phosphoric acid solution of 10 to 90%. When reflective film frames 104 have been formed, hard mask pattern 200A can be removed.

Figure 4G:
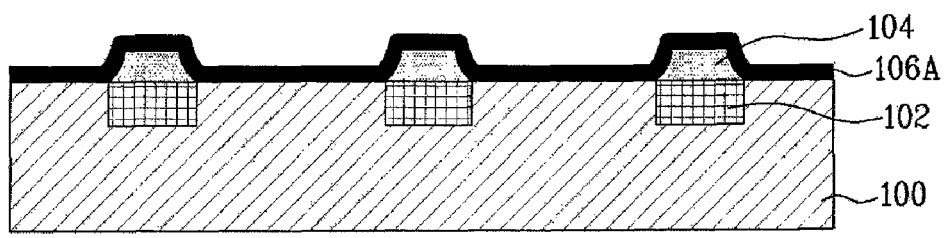

As illustrated in example FIG. 4G, reflective film layer 106A can then be formed on and/or over entire surface of the semiconductor substrate 100 to cover the reflective film frames 104. Reflective film layer 106A can be made of a metal material and can be formed by any metal film deposition method for forming a metal film used in a process of manufacturing a semiconductor device. Preferably, reflective film layer 106A can be formed by a chemical vapor deposition (CVD) method or a physical vapor deposition (PVD) method.

Figure 4H:
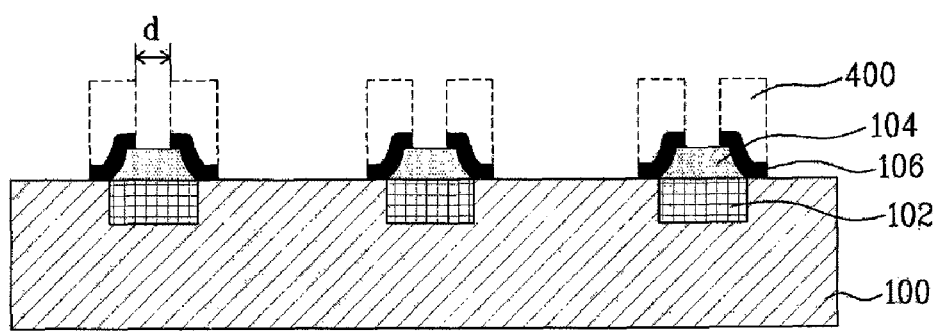

As illustrated in example FIG. 4H, photoresist film pattern 400 for forming reflective films 106 can then be formed on and/or over reflective film layer 106A. Reflective film layer 106A can then be selectively removed by a photolithography process using photoresist film pattern 400 as an etching mask, thereby forming reflective films 106 having openings positioned above photodiodes 102 to receive light. When reflective films 106 have been formed, photoresist film pattern 400 can then be removed by ashing. Since reflective film frames 104 are formed by wet etching having a conical shape with bent sidewalls inclined relative to the upper most surface of photodiodes 102 and/or substrate 100, reflective films 106 can also have a shape conforming or otherwise corresponding to the shape of the sidewalls of reflective film frames 104.

As illustrated in example FIGS. 4A to 4H, after reflective films 106 are formed, the image sensor can be completed by a method of manufacturing an image sensor. For example, in a case where the image sensor is manufactured as illustrated in example FIG. 2, the method of manufacturing an image sensor is explained as follows. Interlayer insulating film 108 can be formed on and/or over semiconductor substrate 100 including reflective films 106. After interlayer insulating film 108 is formed, protective film 110 can then be formed on and/or over interlayer insulating film 108. After protective film 110 is formed, a plurality of color filter layers 112 can then be formed on and/or over protective film 110 at specific intervals. For example, red, green and blue color filter layers 112 can be formed to filter light according to the wavelength band by performing a coating and patterning process on and/or over protective film 110 using dyeable resist. After color filter layers 112 are formed, planarization layer 114 can then be formed on and/or over entire surface of color filter layers 112. After planarization layer 114 is formed, micro lenses 116 can be formed on and/or over planarization layer 114 corresponding to photodiodes 102. There are various methods for forming micro lenses 116. For example, a material layer for micro lenses, such as resist or SiON, is deposited on and/or over planarization layer 114, and the deposited material layer for micro lenses is selectively patterned and reflowed corresponding to photodiodes 102, thereby forming micro lenses 116. For example, as illustrated in example FIG. 2, micro lenses 116 can be formed in a hemispherical shape. In this case, micro lenses 116 can be formed to have an optimal size, thickness and radius of curvature, which are determined according to the size, position and shape of a unit pixel, the thickness of light sensing devices 102, the height, position and size of a light blocking layer, and the like.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image sensor comprising:
   a plurality of photodiodes formed on a semiconductor substrate;
   a reflective film frame formed directly on each of the photodiodes, the reflective film frame having sidewalls that are inclined with respect to the uppermost surface of the photodiodes; and
   a reflective film formed directly on the sidewalls of the reflective film frame, the reflective film forming an opening over a respective one of the photodiodes for receiving light, wherein a bottom surface of the reflective film returns light reflected by the respective one of the photodiodes to the respective one of the photodiodes.

2. The image sensor of claim 1, further comprising:
   an interlayer insulating film formed on the semiconductor substrate including the reflective film;
   a protective film formed on the interlayer insulating film;
   a plurality of color filter layers formed on the protective film at specific intervals;
   a planarization layer formed on the semiconductor substrate including the color filter layers; and
   a micro lens formed on the planarization layer corresponding to a respective one of the photodiodes.

3. The image sensor of claim 1, wherein the reflective films are composed of a metal material.

4. The image sensor of claim 1, wherein the opening occupies between 70 to 90% of an uppermost surface area of a respective one of the photodiodes.

5. The image sensor of claim 1, wherein the reflective film frame is composed of an oxide material.

6. The image sensor of claim 2, wherein the interlayer insulating film comprises a plurality of insulating layers.

7. The image sensor of claim 2, wherein the color filter layers comprise red, green and blue color filter layers.

* * * * *